United States Patent
Kim et al.

(10) Patent No.: US 8,586,978 B2
(45) Date of Patent: Nov. 19, 2013

(54) NON-VOLATILE MEMORY DEVICE INCLUDING DIODE-STORAGE NODE AND CROSS-POINT MEMORY ARRAY INCLUDING THE NON-VOLATILE MEMORY DEVICE

(75) Inventors: Ki-hwan Kim, Anyang-si (KR); Young-soo Park, Yongin-si (KR); Bo-soo Kang, Seoul (KR); Myoung-jae Lee, Suwon-si (KR); Chang-bum Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 728 days.

(21) Appl. No.: 12/216,529

(22) Filed: Jul. 7, 2008

(65) Prior Publication Data

US 2009/0116272 A1    May 7, 2009

(30) Foreign Application Priority Data

Nov. 2, 2007 (KR) .................. 10-2007-0111584

(51) Int. Cl.
*H01L 29/12* (2006.01)
*H01L 21/00* (2006.01)

(52) U.S. Cl.
USPC ...... 257/43; 257/E29.086; 257/613; 438/104; 365/72; 365/175

(58) Field of Classification Search
USPC ............... 257/43, E29.068, 613; 438/104; 365/72, 175
See application file for complete search history.

(56) References Cited

U.S. PATENT DOCUMENTS

| | | | |
|---|---|---|---|
| 7,042,035 B2 * | 5/2006 | Rinerson et al. | 257/295 |
| 2008/0001143 A1 * | 1/2008 | Nomura et al. | 257/40 |
| 2008/0006907 A1 * | 1/2008 | Lee et al. | 257/613 |
| 2008/0278990 A1 * | 11/2008 | Kumar et al. | 365/148 |

* cited by examiner

*Primary Examiner* — Long Pham
(74) *Attorney, Agent, or Firm* — Harness, Dickey & Pierce P.L.C.

(57) ABSTRACT

Provided are a non-volatile memory device and a cross-point memory array including the same which have a diode characteristic enabling the non-volatile memory device and the cross-point memory array including the same to operate in a simple structure, without requiring a switching device separately formed so as to embody a high density non-volatile memory device. The non-volatile memory device includes a first electrode; a diode-storage node formed on the first electrode; and a second electrode formed on the diode-storage node.

14 Claims, 8 Drawing Sheets

NON-VOLATILE MEMORY DEVICE INCLUDING DIODE-STORAGE NODE AND CROSS-POINT MEMORY ARRAY INCLUDING THE NON-VOLATILE MEMORY DEVICE

CROSS-REFERENCE TO RELATED PATENT APPLICATION

This application claims the benefit of Korean Patent Application No. 10-2007-0111584, filed on Nov. 2, 2007, in the Korean Intellectual Property Office, the disclosure of which is incorporated herein in its entirety by reference.

BACKGROUND OF THE INVENTION

1. Field of the Invention

The present invention relates to a non-volatile memory device and a cross-point memory array including the same, and more particularly, to a non-volatile memory device and a cross-point memory array including the same which have a diode characteristic enabling the non-volatile memory device and the cross-point memory array including the same to operate in a simple structure, without requiring a switching device separately formed so as to embody a high density non-volatile memory device.

2. Description of the Related Art

It is preferable that a semiconductor memory device has a lot of memory cells formed in each unit region so as to have high integration, has high operating speed, and can operate with low power. For this purpose, many researches have been conducted, and many kinds of memory devices have been developed.

In general, the semiconductor memory device includes a lot of memory cells which are connected in a circuit. In the case of a dynamic random access memory (DRAM) which is a representative semiconductor memory device, a unit memory cell is generally comprised of a switch and a capacitor. The DRAM is advantageous due to its high integration and high operation speed. However, the DRAM is disadvantageous since it loses all stored data when power is off. On the other hand, a flash memory is a representative example of a non-volatile memory device which can retain stored data when power is off. The flash memory is non-volatile in contrast with a volatile memory, but the flash memory is disadvantageous due to its low integration and low operating speed, compared to the DRAM.

A magnetic random access memory (MRAM), a ferroelectric random access memory (FRAM), a phase-change random access memory (PRAM), a resistance random access memory (RRAM), and the like are examples of the non-volatile memory device for which many researches have been conducted.

The MRAM stores data by using a change of a magnetization direction in a tunnel junction. The FRAM stores data by using ferroelectric polarization. The MRAM and the FRAM respectively have advantages and disadvantages. However, as described above, the MRAM and the FRAM are being researched and developed so as to have high integration, high operating speed, high data retention, and to operate with low power. The PRAM stores data by using a change in a resistance value according to a phase-change of a specific material, and has a structure including a resistor and a switch (transistor). The resistor which is used for the PRAM is a calcogenide resistor. The calcogenide resistor adjusts a forming temperature and becomes a crystalline state or an amorphous state. In general, since a resistance in the amorphous state is higher than the resistance in the crystalline state, a memory device is formed by using this attribute.

The RRAM uses a characteristic (a resistance change characteristic) in which a resistance value is differed due to an applied voltage. Materials showing such a resistance change characteristic are an extraordinary magnetoresistive material such as Pr0.3Ca0.7MnO3 (PCMO), a binary transition metal oxide, a ferroelectric material, a programmable metallization cell (PMC) material on which a material having a high ion mobility is doped, and the like. Examples of the binary transition metal oxide are $ZnO$, $TiO_2$, $Nb_2O_5$, $ZrO_2$ or $NiO$, etc.

Meanwhile, in order to form the RRAM having a cross-point array structure, a separate switch structure is required so as to write and read information without interference from an adjacent cell. Thus, in general, a memory device has a structure which is connected to a transistor structure or a diode structure.

SUMMARY OF THE INVENTION

The present invention provides a non-volatile memory device which has a storage node serving as a diode function, and a cross-point memory array which includes the non-volatile memory device.

According to an aspect of the present invention, there is provided a non-volatile memory device, including a first electrode; a diode-storage node formed on the first electrode; and a second electrode formed on the diode-storage node The diode-storage node may simultaneously perform a diode function and an information storage function by including a p-n junction or by forming a Schottky contact on an interface of an electrode.

According to another aspect of the present invention, there is provided a method of programming a non-volatile memory device including a first electrode, a diode-storage node formed on the first electrode, and a second electrode formed on the diode-storage node, the method includes operations of reversely applying a vias pulse to the diode-storage node, changing the amount of a current flowing in the diode-storage node, and storing information.

At this time, the information may be stored with multi-bit by adjusting a size of the vias pulse.

According to another aspect of the present invention, there is provided a cross-point memory array including a plurality of first electrode lines which are formed to be parallel to each other in a first direction; a plurality of second electrode lines which are formed to be parallel to each other in a second direction; and a plurality of diode-storage nodes formed at intersections between the plurality of first electrode lines and the plurality of second electrode lines.

The cross-point memory array may be formed to have a stacked structure including more than two layers. The cross-point memory array having the stacked structure further includes a plurality of third electrode lines formed on the plurality of second electrode lines in the first direction, and a plurality of additional diode-storage nodes formed at intersections between the plurality of second electrode lines and the plurality of third electrode lines.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
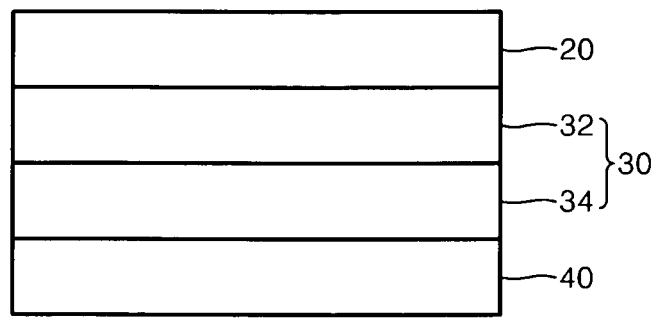
FIG. 1 is a cross-sectional view of a non-volatile memory device according to an embodiment of the present invention.

A non-volatile memory device having a diode characteristic and a cross-point memory array including the non-volatile memory device according to embodiments of the present invention will now be described more fully with reference to the accompanying drawings, in which exemplary embodiments of the invention are shown. In the drawings, the thicknesses and the widths of layers are exaggerated for clarity.

In the present invention, a diode-storage node is a unit structure which simultaneously performs a diode function and an information storage function by an applied current or an applied voltage.

FIG. 1 is a cross-sectional view of a non-volatile memory device having a diode characteristic according to an embodiment of the present invention.

Referring to FIG. 1, the non-volatile memory device having the diode characteristic according to the current embodiment of the present invention has a structure in which a first electrode 20, a diode-storage node 30 including an n-type oxide layer 32 and a p-type oxide layer 34, and a second electrode 40 are sequentially formed.

The first electrode 20 or the second electrode 40 is formed of a metal having an electric conductivity, or is formed of a metal oxide. To be more specific, the first electrode 20 or the second electrode 40 is formed of a platinum group element such as Pt, Ir, and the like, Ni, Pd, a refractory metal such as Mo, or metal oxides formed of the aforementioned metals, but the present invention is not limited thereto.

The diode-storage node 30 includes the n-type oxide layer 32 and the p-type oxide layer 34, and has a structure in which a p-n junction is formed between the n-type oxide layer 32 and the p-type oxide layer 34. Information may be stored in the diode-storage node 30 by reversely applying a bias voltage to the p-n junction. When an on-current is changed by reversely applying the bias voltage via the first and second electrodes 20 and 40, the information stored in the diode-storage node 30 is read. To be more specific, whether or not (0 or 1) to store data is determined by a difference in a size of a current value measured when a reading voltage is applied. In addition, it may be possible to store information with multi-bit since the amount of the on-current flowing on a subsequent storage node is differed according to a size of the bias voltage reversely applied to the diode-storage node 30.

Figure 2A:
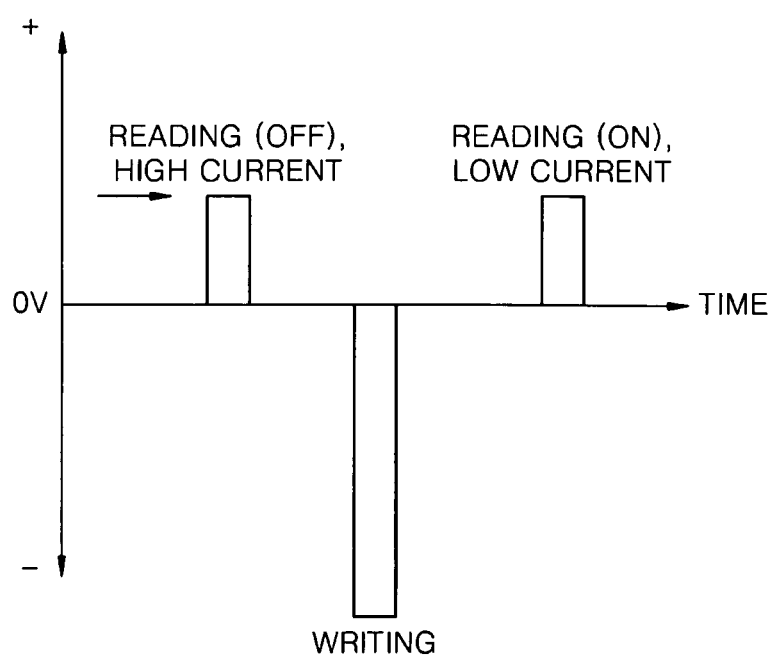
FIGS. 2A and 2B are electrical pulse diagrams for illustrating an operating principle of the non-volatile memory device according to the embodiment of the present invention.
Figure 2B:
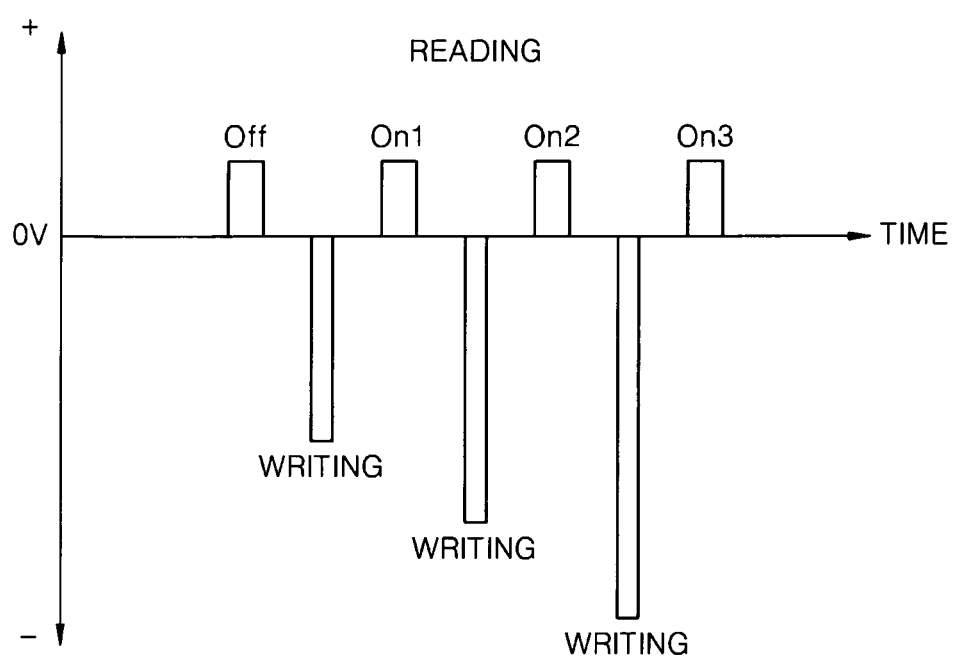

FIGS. 2A and 2B are electrical pulse diagrams of a voltage against a time, wherein the diagrams illustrate an operating principle of the diode-storage node 30 according to the embodiment of the present invention. Referring to FIG. 2A, when the read voltage is forwardly applied to the diode-storage node 30 including the p-n junction, an OFF state is read, wherein a high current having low resistance flows in the OFF state. Also, a writing operation is performed by applying a relatively high reverse voltage to the diode-storage node 30. When the reading voltage is forwardly applied again, the diode-storage node 30 becomes an ON state in which a low current flows due to an increased resistance value of a diode.

FIG. 2B is the electrical pulse diagram for illustrating a multi-bit embodiment of the diode-storage node 30 according to the embodiment of the present invention. According to FIG. 2B, if a size of the reversely applied voltage is differed, the multi-bit embodiment is possible by dividing the ON state into more than three states. The larger the size of the reversely applied voltage, the higher the resistance value of the diode in the ON state. Hence, the amount of the on-current is decreased. In FIG. 2B, the amount of the on-current in the diode-storage node 30 is in an order of OFF>On 1>On 2>On 3. As illustrated in FIG. 2B, at least four states may be defined, and thus, the multi-bit embodiment is possible.

The n-type oxide layer 32 may be a Zn oxide, an In oxide, a Zn—In composite oxides, and the like. The p-type oxide layer 34 may be a CuO, NiO, $TiO_2$, HfO, ZrO, $WO_3$, CoO, $Nb_2O_5$, and the like. However, the present invention is not limited thereto.

Figure 3A:
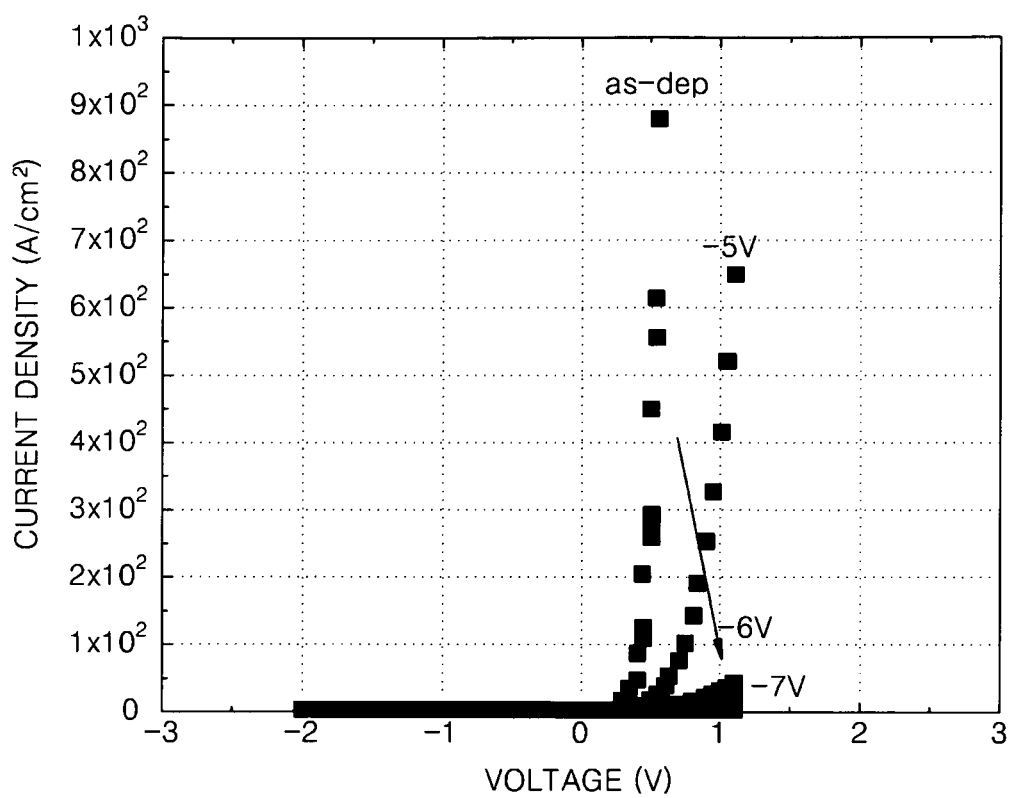
FIGS. 3A and 3B are graphs for illustrating a voltage-current density curve of the non-volatile memory device according to the embodiment of the present invention.
Figure 3B:
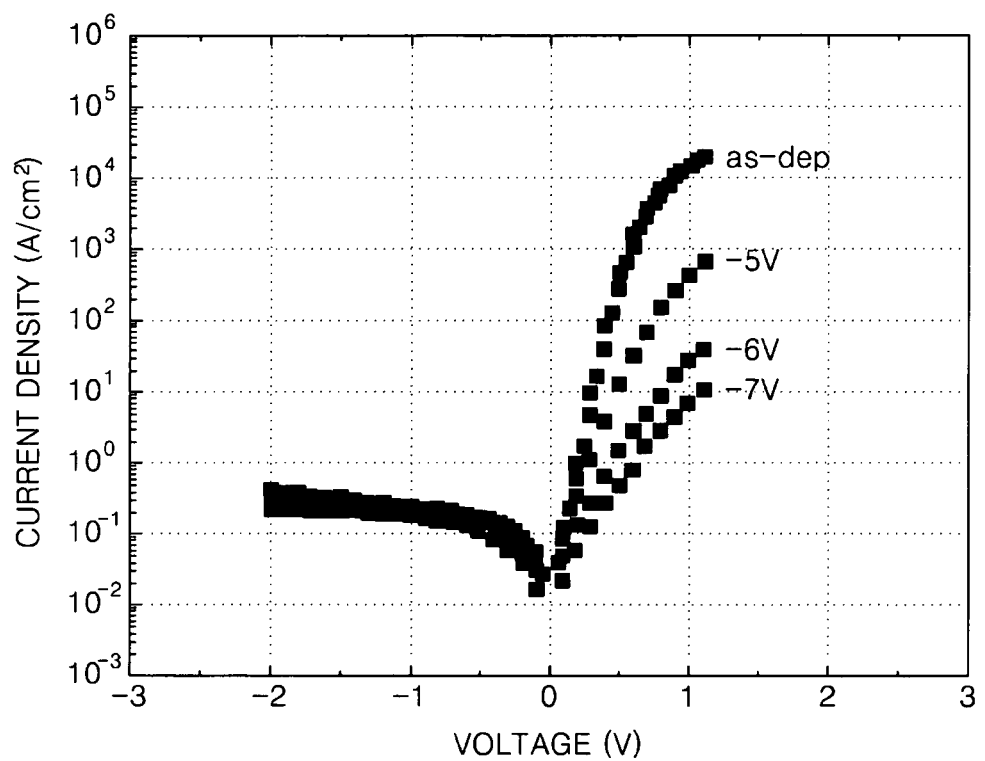

FIGS. 3A and 3B are graphs for illustrating a voltage-current density curve of the non-volatile memory cell using Pt as the first and second electrodes 20 and 40. Here, CuO was used as the p-type oxide layer 34, and InZnO was used as the n-type oxide layer 32. FIG. 3A corresponds to a log scale curve, and FIG. 3B corresponds to a linear scale curve. Referring to FIGS. 3A and 3B, it is possible to understand that the amount of the on-current is decreased when a bias pulse is reversely applied, compared to the amount of the on-current in a device formation state (as-depo). Further, it is possible to understand that the on-current of the non-volatile memory cell is changed by changing a size of the bias pulse which is reversely applied.

Also, in the graphs of FIGS. 3A and 3B, it is possible to understand that a current flow in a negative voltage region is inhibited after the bias pulse is reversely applied. In consideration of this fact, it may be possible to predict that the diode characteristic of the diode-storage node 30 remains still after an information writing operation is performed, and therefore, it is possible to read stored information without interference from an adjacent cell, although a separate switching device is not added.

Figure 4:
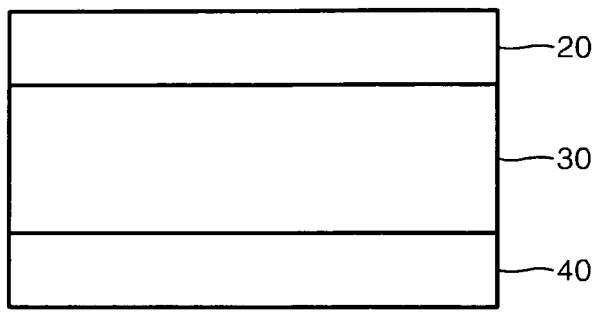
FIG. 4 is a cross-sectional view of a non-volatile memory device according to another embodiment of the present invention.

FIG. 4 is a cross-sectional view of a non-volatile memory device having a diode characteristic according to another embodiment of the present invention.

Referring to FIG. 4, the non-volatile memory device having the diode characteristic according to the current embodiment of the present invention has a structure in which a first electrode 20, a diode-storage node 30 formed of an oxide semiconductor material layer, and a second electrode 40 are sequentially formed.

The first electrode 20 or the second electrode 40 is formed of a metal having an electric conductivity, or is formed of a metal oxide. To be more specific, the first electrode 20 or the second electrode 40 is formed of a platinum group element such as Pt, Ir, and the like, Ni, Pd, a refractory metal such as Mo, or metal oxides formed of the aforementioned metals, but the present invention is not limited thereto.

The diode-storage node 30 is formed of a material forming a Schottky junction on an interface of the first electrode 20 or on an interface of the second electrode 40. Examples of the material are a Zn oxide, an In oxide, a Zn—In composite oxides, and the like.

Meanwhile, the diode-storage node 30 simultaneously performs a diode function and an information storage function. Information may be stored in the diode-storage node 30 by reversely applying a bias voltage to the Schottky junction formed between the diode-storage node 30 and one of the first and second electrodes 20 and 40. When an on-current of the diode-storage node 30 is changed by reversely applying the bias voltage via the first and second electrodes 20 and 40, stored data information is read therefrom. In addition, it may be possible to store information with multi-bit since the amount of the on-current flowing on a subsequent storage node is differed according to a size of the bias voltage reversely applied to the diode-storage node 30.

Figure 5A:
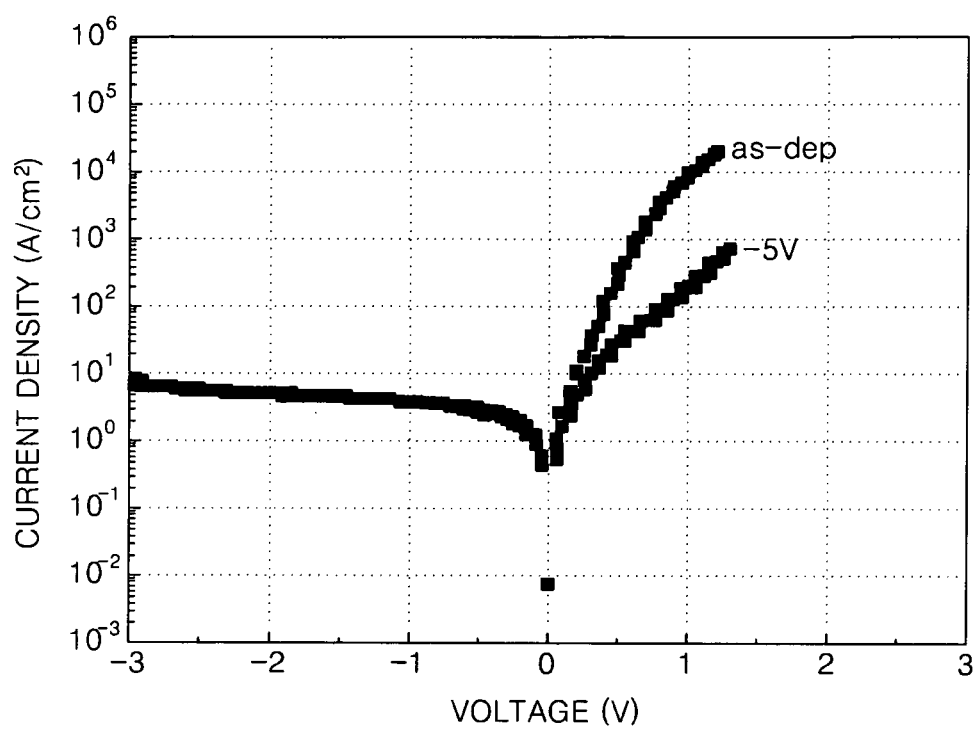
FIGS. 5A and 5B are graphs for illustrating a voltage-current density curve of the non-volatile memory device according to the other embodiment of the present invention.
Figure 5B:
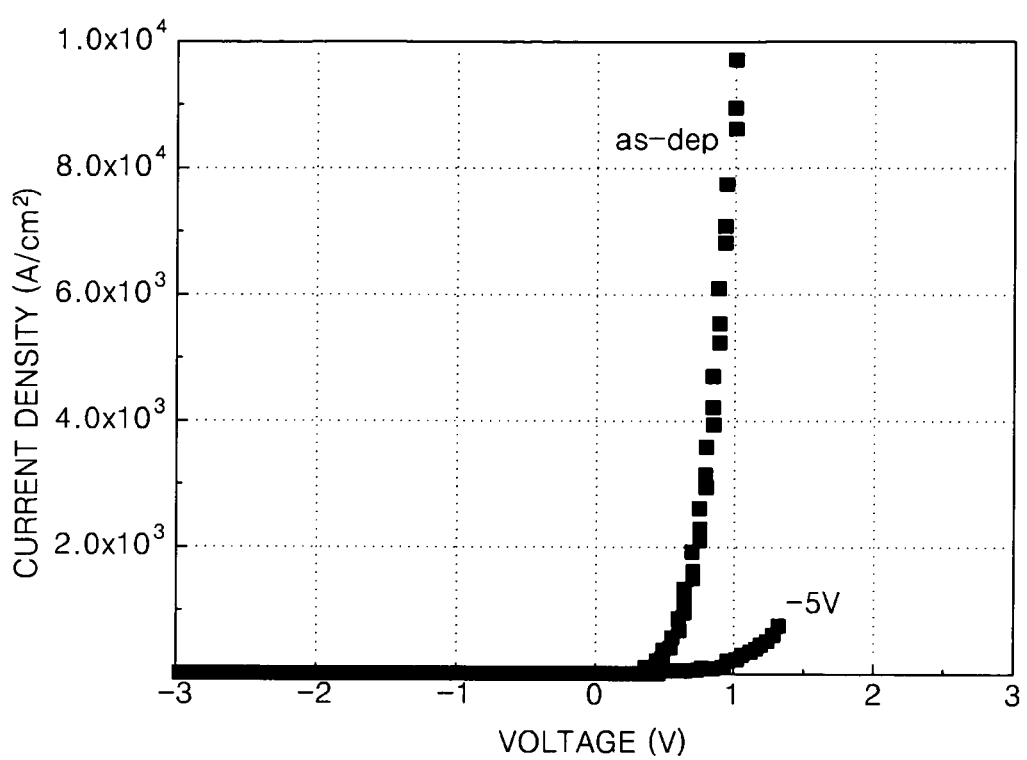

FIGS. 5A and 5B are graphs for illustrating a voltage-current density curve of the non-volatile memory device using InZnO as the diode-storage node 30 and using Pt as the first and second electrodes 20 and 40. As seen in FIGS. 5A and 5B, an on-current is decreased after a bias pulse of −5V is reversely applied, and thus, storage of information is enabled. Also, in the graphs of FIGS. 5A and 5B, it is possible to understand that a current flow in a negative voltage region is inhibited after the vias pulse is reversely applied. In consideration of this fact, it may be possible to predict that the diode characteristic of the diode-storage node 30 remains still after an information writing operation is performed, and therefore, it is possible to read stored information without interference from an adjacent cell, although a separate switching device is not added.

Figure 6:
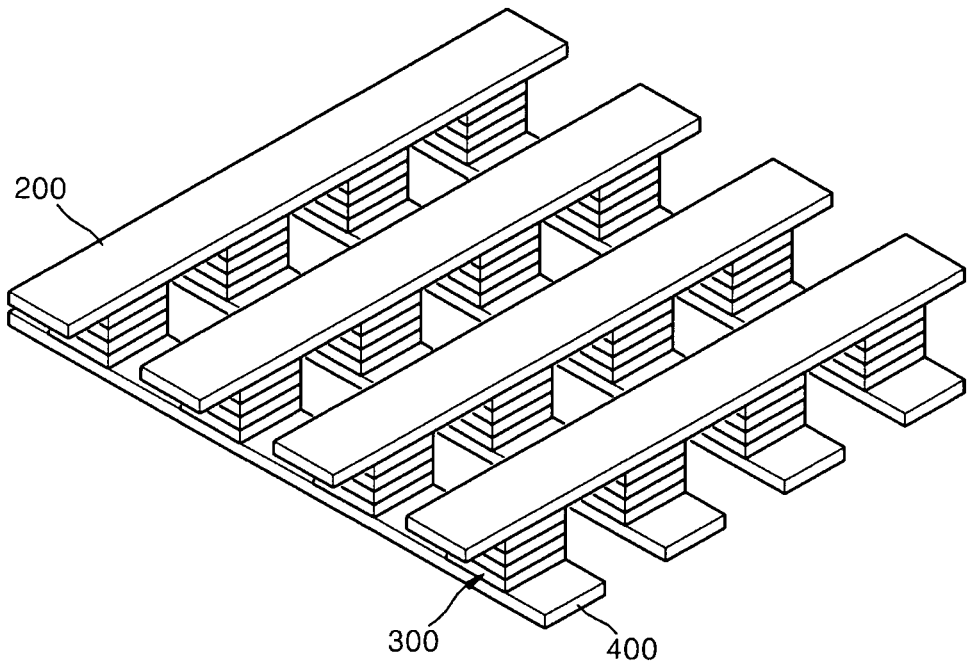
FIG. 6 is a perspective view of a structure of a cross-point memory array according to another embodiment of the present invention.

FIG. 6 is a perspective view of a structure of a non-volatile cross-point memory array according to another embodiment of the present invention.

The non-volatile cross-point memory array according to the current embodiment of the present invention has the structure in which a plurality of diode-storage nodes 300 are formed at intersections between a plurality of first electrode lines 200 formed in a first direction and a plurality of second electrode lines 400 formed in a second direction. According to such a structure, a non-volatile memory cell according to the previous embodiment of the present invention is formed at the intersections.

Information is stored in the diode-storage node 300 by selecting one of the plurality of first electrode lines 200 and one of the plurality of second electrode lines 400, and by reversely applying a bias voltage via the selected first and second electrodes 200 and 400 so as to change an on-current value of the diode-storage node 300. After that, whether or not (0 or 1) to store information is determined by a difference in a current value measured when a reading voltage is applied to the diode-storage node 300.

Meanwhile, since it is possible to adjust the on-current value according to a size of the bias voltage applied when the information is stored, it is also possible to store and read the information with multi-bit.

Figure 7:
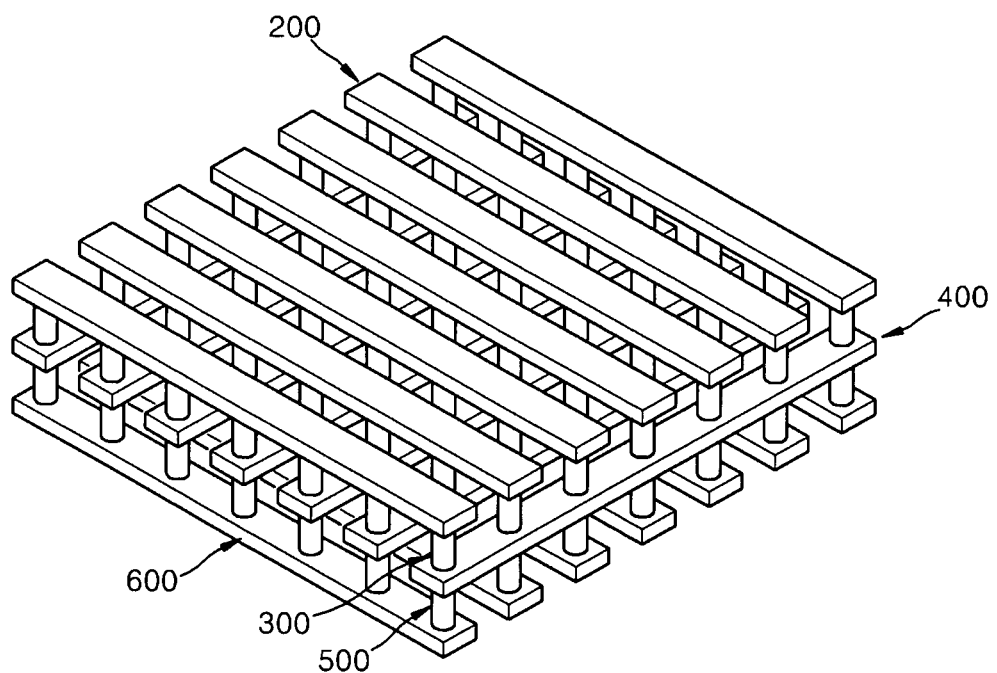
FIG. 7 is a perspective view of a stacked structure of the cross-point memory array according to the other embodiment of the present invention.

In FIG. 6, the non-volatile cross-point memory array has a single-layered structure. However, the non-volatile cross-point memory array may have a structure illustrated in FIG. 7 in which second diode-storage nodes 500 and third electrode lines 600 are formed under the plurality of second electrode lines 400 which serve as a common electrode. Otherwise, the non-volatile cross-point memory array may have a double-layered structure (not shown) in which upper electrodes of first diode-storage nodes and lower electrodes of second diode storage nodes are divided by insulators.

What is claimed is:

1. A non-volatile memory device, comprising:
   a first electrode;
   a diode-storage node formed on the first electrode, the diode-storage node including a p-type oxide layer directly formed on the first electrode and an n-type oxide layer directly formed on the p-type oxide layer; and
   a second electrode directly formed on the n-type oxide layer,
   wherein the diode-storage node is adapted to store information when a bias voltage is reversely applied so as to change an on-current value of the diode-storage node,
   wherein the diode-storage node includes a CuO layer and an InZnO layer, and the first and second electrodes include Pt,
   wherein the p-type oxide layer is formed of at least one material selected from a group comprising CuO, NiO, $TiO_2$, HfO, ZrO, $WO_3$, CoO, and $Nb_2O_5$, and
   the n-type oxide layer is formed of at least one material selected from a group comprising a Zn oxide, an In oxide, and a Zn—In composite oxides.

2. A non-volatile memory device, comprising:
   a first electrode;
   a diode-storage node on the first electrode, the diode-storage node including a p-type oxide layer directly formed on the first electrode and an n-type oxide layer directly formed on the p-type oxide layer, and the diode-storage node being adapted to store information when a bias voltage is reversely applied so as to change an on-current value of the diode-storage node;
   a second electrode directly formed on the n-type oxide layer,
   wherein the diode-storage node includes an oxide material forming a Schottky junction with one of the first and second electrodes,
   wherein the diode-storage node includes an InZnO material, and the first and second electrodes include Pt.

3. The non-volatile memory device of claim 2, wherein the oxide material is formed of at least one material selected from a group comprising a Zn oxide, an In oxide, and a Zn—In composite oxides.

4. The non-volatile memory device of claim 2, wherein the non-volatile memory device stores information with a plurality of bits.

5. A cross-point memory array, comprising:
   a plurality of first electrode lines which are formed to be parallel to each other in a first direction;
   a plurality of second electrode lines which are formed to be parallel to each other in a second direction; and
   a plurality of diode-storage nodes directly formed at intersections between the plurality of first electrode lines and the plurality of second electrode lines,
   wherein a first diode-storage node, selected from the plurality of diode-storage nodes, includes a p-type oxide layer directly formed on one of the first electrode lines and an n-type oxide layer directly formed between the p-type oxide layer and one of the second electrode lines, and
   the first diode-storage node is adapted to store information when a bias voltage is reversely applied so as to change an on-current value of the first diode-storage node.

6. The cross-point memory array of claim 5, wherein the p-type oxide layer comprises at least one material selected from a group comprising CuO, NiO, $TiO_2$, HfO, ZrO, $WO_3$, CoO, and $Nb_2O_5$, and
   the n-type oxide layer comprises at least one material selected from a group comprising a Zn oxide, an In oxide, and a Zn—In composite oxides.

7. The cross-point memory array of claim 5, wherein each of the plurality of diode-storage nodes comprises a CuO layer and an InZnO layer, and the plurality of first and second electrode lines comprise Pt.

8. A cross-point memory array, comprising:
a plurality of first electrode lines parallel to each other in a first direction;
a plurality of second electrode lines parallel to each other in a second direction; and
a plurality of diode-storage nodes directly formed at intersections between the plurality of first electrode lines and the plurality of second electrode lines,
wherein a first diode-storage node, selected from the plurality of diode-storage nodes, includes an oxide material forming a Schottky junction with the plurality of first and second electrode lines,
the first diode-storage node includes a p-type oxide layer directly formed on one of the first electrode lines and an n-type oxide layer directly formed between the p-type oxide layer and one of the second electrode lines, and
the first diode-storage node is adapted to store information when a bias voltage is reversely applied so as to change an on-current value of the first diode-storage node.

9. The cross-point memory array of claim 8, wherein the oxide material comprises at least one material selected from a group comprising a Zn oxide, an In oxide, and a Zn—In composite oxides.

10. The cross-point memory array of claim 8, wherein the plurality of diode-storage nodes comprise an InZnO material, and the plurality of first and second electrode lines comprise Pt.

11. The cross-point memory array of claim 5, wherein the cross-point memory array stores information with a plurality of bits.

12. The cross-point memory array of claim 5, further comprising:
a plurality of third electrode lines which are formed to be parallel to each other on the plurality of second electrode lines in the first direction; and
a plurality of additional diode-storage nodes formed at intersections between the plurality of second electrode lines and the plurality of third electrode lines.

13. A method of programming a non-volatile memory device having a first electrode, a diode-storage node including a p-type oxide layer directly formed on the first electrode and an n-type oxide layer directly formed on the p-type oxide layer, and a second electrode formed on the n-type oxide layer, the method comprising:
reversely applying a bias pulse to the diode-storage node, changing the amount of a current flowing in the diode-storage node; and
storing information,
wherein the diode-storage node includes a CuO layer and an InZnO layer, and the first and second electrodes include Pt,
wherein the p-type oxide layer is formed of at least one material selected from a group comprising CuO, NiO, $TiO_2$, HfO, ZrO, $WO_3$, CoO, and $Nb_2O_5$, and
the n-type oxide layer is formed of at least one material selected from a group comprising a Zn oxide, an In oxide, and a Zn—In composite oxides.

14. The method of claim 13, wherein the information is stored with a plurality of bits by adjusting a size of the bias pulse.

* * * * *